US010911045B1

(12) United States Patent
Ming et al.

(10) Patent No.: US 10,911,045 B1
(45) Date of Patent: Feb. 2, 2021

(54) SEGMENTED DIRECT GATE DRIVE CIRCUIT OF A DEPLETION MODE GAN POWER DEVICE

(71) Applicant: University of Electronic Science and Technology of China, Chengdu (CN)

(72) Inventors: Xin Ming, Chengdu (CN); Bo Zhang, Chengdu (CN); Qifei Xu, Chengdu (CN); Shuai Mao, Chengdu (CN); Xudong Feng, Chengdu (CN); Zhuo Wang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 17/005,350

(22) Filed: Aug. 28, 2020

(30) Foreign Application Priority Data

Apr. 3, 2020 (CN) .......................... 2020 1 0257376

(51) Int. Cl.
*H03K 17/687* (2006.01)
(52) U.S. Cl.
CPC .................. *H03K 17/6872* (2013.01)
(58) Field of Classification Search
CPC .......................... H03K 17/6872; H03K 17/687
USPC ................................................. 327/108–112
See application file for complete search history.

(56) References Cited

U.S. PATENT DOCUMENTS

| 7,463,068 | B2* | 12/2008 | Lee ...................... H01L 27/0251 326/115 |
| 7,683,687 | B2* | 3/2010 | Kawashima ......... H03K 3/3565 327/206 |
| 7,724,046 | B2* | 5/2010 | Wendt ................ H03K 17/6872 327/110 |
| 10,601,302 | B1* | 3/2020 | Sharma ................. H02M 3/158 |
| 2009/0261866 | A1* | 10/2009 | Shibata ............... H03F 3/45475 327/108 |
| 2016/0164517 | A1* | 6/2016 | Sharma ............... H03F 3/45385 327/108 |

* cited by examiner

*Primary Examiner* — Tomi Skibinski
(74) *Attorney, Agent, or Firm* — Bayramoglu Law Offices LLC

(57) ABSTRACT

A segmented direct gate drive circuit of a depletion mode GaN power device, a gate voltage of the GaN power device is charged from a negative voltage turn-off level to a threshold voltage of the GaN power device; when the gate voltage of the GaN power device is charged to the threshold voltage of the GaN power device, a current mirror charging module first turns on less than N of charging current mirror modules to charge the gate voltage of the GaN power device from the threshold voltage of the GaN power device to a Miller platform voltage of the GaN power device, and turns on N charging current mirror modules to charge the gate voltage of the GaN power device from the Miller platform voltage of the GaN power device to a zero level.

10 Claims, 5 Drawing Sheets

(a-1)

(a-2)

(b)

US 10,911,045 B1

SEGMENTED DIRECT GATE DRIVE CIRCUIT OF A DEPLETION MODE GAN POWER DEVICE

CROSS-REFERENCE TO RELATED APPLICATIONS

This application is based upon and claims priority to Chinese Patent Application No. 202010257376.6, filed on Apr. 3, 2020, the entire contents of which are incorporate herein by reference.

TECHNICAL FIELD

The invention relates to a field of electronic circuit technology, and in particular relates to a segmented direct gate drive circuit for a depletion-mode GaN power device.

BACKGROUND

The uses of the traditional 600V high voltage power supply, known as the primary power supply, include a CoolMOS configuration. However, since a body diode of a CoolMOS causes problem in the reverse recovery, and its large gate charge $Q_G$ and output charge $Q_{OSS}$ lead to large switching losses under hard switching, it has a low conversion efficiency and limited switching frequency in soft switching mode. Compared with Si MOSFET, the non-linearity of an output capacitance $C_{OSS}$ in a GaN device that follows the change of a drain-source voltage $V_{DS}$ is low. Under the premise of a same on-resistance, a lower output charge $Q_{OSS}$ and gate charge $Q_G$ can be obtained without a body diode in the GaN device. Therefore, in a GaN-based soft-switching application, the resonance period is shorter, the power output time is longer, the conduction losses of a resonant converter is reduced, and the switching frequency and the power density is higher.

Currently, products of 650V voltage level GaN power devices are commercially available, the currently know technical solutions include the p-GaN technology and the Cascode-drive technology. A high mobility 2DEG channel formed by an AlGaN/GaN heterojunction of a GaN power device has a natural conduction characteristic. In order to ensure system safety of a power conversion circuit, using GaN as a power level device is required to have a normally-off characteristic. Within the p-GaN technology, a layer of P-type GaN (the specific material, for example, can be p-AlGaN, p-GaN or p-InGaN) is inserted between the AlGaN/GaN heterojunction surface and a gate Schottky metal, as shown in FIG. 1a-1. The p-GaN lifts a conduction band of the entire heterojunction, thereby depleting a two-dimensional electron gas in a conduction channel of the heterojunction, and transforming the device from the depletion mode to an enhancement mode. However, due to p-GaN has a relatively low threshold voltage, a typical Vth value of which is 1.5V, in a high voltage application where VIN>400V, the dv/dt of a switch node can reach up to 200 V/ns during switching. A "Miller effect" during turn-on still exists, this is true even if a separate charge-discharge path technology in a low-voltage drive circuit design is used in a high voltage application, see example of FIG. 1a-2. In addition, because a gate-source breakdown voltage of the p-GaN is low (<7V), and a safe working margin of a gate drive voltage of the device is low, a significant impact on reliability of the device arises, which complicates the design of the drive circuit and system.

In a Cascode-drive solution, a high voltage depletion mode GaN and a low voltage Si MOSFET are used in series, a normally-off Si MOSFET is used to obtain enhanced characteristics of the entire device, see FIG. 1(b) for an example. The Cascode-drive drives the Si MOSFETs in series, and controls switching of the depletion-mode GaN through the change of the drain-source voltage Vds of the Si MOSFET. Therefore, a traditional Si power device drive circuit is used to reuse the Cascode-drive, which eliminates the problems of a low threshold voltage and a low gate-source voltage resistance of the p-GaN. However, since the Si MOSFET is still required to be switched in each switching cycle, the problem of reverse recovery caused by the Si body diode is still present in the Cascode-drive configuration. Meanwhile, an interconnection parasitic inductance is introduced into the tandem structure of the GaN and the Si MOSFET, which is prone to produce voltage oscillation at a tandem node under high speed switching, thereby causing the switching speeds of the Si MOSFET and the GaN to be mismatched, or even threatens the reliability of the Si MOSFET, e.g., an avalanche breakdown. Since switching of the depletion-mode GaN device is controlled by the drain-source voltage Vds of the Si MOSFET, and a power level switching speed cannot be controlled directly by the drive circuit, it is difficult to optimize an EMI characteristic of a Cascode-drive power level. In addition, as shown in FIG. 1(b), the parasitic capacitance of an actual Cascode device includes the parasitic capacitances of the Si MOSFET and the GaN. If the capacitances are mismatched due to a process influence or a device size design, the voltage across the Cds_Si may be caused by a turn-off action to be charged through a charge transfer to exceed the avalanche breakdown voltage of the Si MOSFET, resulting in the Si MOSFET undergoing an avalanche breakdown.

SUMMARY

To solve the technical problem involving the difficulty of controlling the switching speed and low reliability of the above-mentioned methods of driving a traditional GaN power device, the present invention uses a segmented direct gate drive circuit of a depletion mode GaN power device, in which the depletion mode GaN power device is controlled by direct gate driving and a segmented control technology is introduced to obtain characteristics of a controllable switching speed and high reliability.

The technical solutions of the present invention are as follows:

A segmented direct gate drive circuit of a depletion mode GaN power device, wherein an output signal of the segmented direct gate drive circuit is used to control charging and discharging of a gate voltage of the depletion mode GaN power device; the depletion mode GaN power device is turned off when its gate voltage is discharged to a negative voltage turn-off level, and turned on when its gate voltage is charged to a zero level;

The segmented direct gate drive circuit includes a fast charging module, a current mirror charging module, a gate voltage holding module and a discharging module; the fast charging module is used to charge the gate voltage of the GaN power device from the negative voltage turn-off level to a threshold voltage of the GaN power device; the fast charging module includes a fast charging unit, a threshold setting unit and a one-out-of-two switching unit, The threshold setting unit includes an adjustable resistor, a first capacitor, a first current mirror unit, a second current mirror unit, a first high voltage PMOS transistor, a second high voltage PMOS transistor, a fifth high voltage PMOS transistor, a sixth high voltage PMOS transistor, a fourth high voltage NMOS transistor and a fifth high voltage NMOS transistor, The first current mirror unit is used to mirror a bias current to obtain a first mirror current and a second mirror current;

One end of the adjustable resistor is grounded, and the other end is connected to a source of the first high voltage PMOS transistor;

A source of the second high voltage PMOS transistor is connected to a gate and a drain of the first high voltage PMOS transistor, and a gate and a drain of the second high voltage PMOS transistor are interconnected and connected to gates of the fifth high voltage PMOS transistor, the fourth high voltage NMOS transistor and the fifth high voltage NMOS transistor and the first mirror current, and are connected via the first capacitor to a ground voltage of 0V;

The second current mirror unit is used to mirror the second mirror current to obtain a third mirror current;

A gate of the sixth high voltage PMOS transistor is connected to sources of the fifth high voltage PMOS transistor and the fourth high voltage NMOS transistor and the third mirror current, a source of the sixth high voltage PMOS transistor is connected to the source of the fifth high voltage NMOS transistor and is used as an output terminal of the threshold setting unit, and a drain of the sixth high voltage PMOS transistor is connected to a drain of the fifth high voltage PMOS transistor and the negative voltage turn-off level;

Drains of the fourth high voltage NMOS transistor and the fifth high voltage NMOS transistor are connected to the ground voltage;

The one-out-of-two switching unit includes a fourth resistor, a seventh high voltage PMOS transistor, a sixth high voltage NMOS transistor and a seventh high voltage NMOS transistor, A gate of the seventh high voltage PMOS transistor is connected to a first control signal, a source of the seventh high voltage PMOS transistor is connected via the fourth resistor to the ground voltage, and a drain of the seventh high voltage PMOS transistor is connected to a gate and a drain of the sixth high voltage NMOS transistor, and a gate and a drain of the seventh high voltage NMOS transistor;

The first control signal is a short pulse signal, a rising edge of which is triggered by a rising edge of an input signal of the segmented direct gate drive circuit;

The drain of the sixth high voltage NMOS transistor is used as a first selection terminal of the one-out-of-two switching unit to connect to the output terminal of the threshold setting unit, and the drain of the seventh high voltage NMOS transistor is used as a second selection terminal of the one-out-of-two switching unit;

The fast charging unit includes a fifth resistor and an eighth high voltage NMOS transistor, A gate of the eighth high voltage NMOS transistor is connected to the second selection terminal of the one-out-of-two switching unit and one end of the fifth resistor, a drain of the eighth high voltage NMOS transistor is connected to the ground voltage, and a source of the eighth high voltage NMOS transistor is connected to the other end of the fifth resistor and is used as an output terminal of the fast charging module to connect to a gate of the depletion mode GaN power device:

The current mirror charging module includes N charging current mirror modules, where N is a positive integer greater than 1, and the N charging current mirror modules are respectively used to mirror an adjustable current under control of their corresponding gating signals; each of the charging current mirror modules mirror the adjustable current when its corresponding gating signal is valid, otherwise an output current value is zero; the currents mirrored by the N charging current mirror modules are collectively used to charge the gate voltage of the GaN power device; when the fast charging module charges the gate voltage of the GaN power device to the threshold voltage of the GaN power device, less than N of the charging current mirror modules are first turned on to charge the gate voltage of the GaN power device from the threshold voltage of the GaN power device to a Miller platform voltage of the GaN power device, and then the N charging current mirror modules are turned on to charge the gate voltage of the GaN power device from the Miller platform voltage of the GaN power device to the zero level;

The gate voltage holding module is used to clamp the gate voltage of the GaN power device at the zero level from the time when the gate voltage of the GaN power device is charged by the current mirror charging module to the zero level until the gate voltage of the GaN power device starts to discharge;

The discharging module includes M discharging paths to discharge the gate voltage of the GaN power device, so that the gate voltage of the GaN power device is discharged from the zero level to the negative voltage turn-off level, where M is a positive integer greater than 1; a discharge speed of the gate voltage of the GaN power device is adjusted by controlling the gating of the M discharging paths.

Specifically, the adjustable resistor includes a first PMOS transistor, a second PMOS transistor, a first resistor, a second resistor and a third resistor; a gate of the first PMOS transistor is connected to a first trim control signal, a source of the first PMOS transistor is connected to one end of the first resistor and the ground voltage, and a drain of the first PMOS transistor is connected to the other end of the first resistor;

Specifically, a gate of the second PMOS transistor is connected to a second trim control signal, a source of the second PMOS transistor is connected to one end of the second resistor and the drain of the first PMOS transistor, and a drain of the second PMOS transistor is connected to the other end of the second resistor and connected via the third resistor to the source of the first high voltage PMOS transistor.

Specifically, the gate voltage holding module includes an eleventh high voltage PMOS transistor and a tenth resistor; a gate of the eleventh high voltage PMOS transistor is connected to a third control signal, a source of the eleventh high voltage PMOS transistor is connected to the ground voltage, and a drain of the eleventh high voltage PMOS transistor is connected via the tenth resistor to the gate of the depletion mode GaN power device; the third control signal is flipped to low when the gate voltage of the GaN power device is charged to the zero level, and is flipped to high when the gate voltage of the GaN power device starts to discharge.

Specifically, the charging current mirror module includes a high bandwidth current mirror unit, a main charging path, a voltage clamp protection unit and a discharge protection switching unit, The high bandwidth current mirror unit includes a first NAND gate, a first inverter chain, a sixth resistor, a seventh resistor, a ninth resistor, a second capacitor, an eighth high voltage PMOS transistor, a ninth high voltage PMOS transistor, a tenth high voltage PMOS transistor, a ninth high voltage NMOS transistor, a tenth high voltage NMOS transistor, a fifteenth high voltage NMOS transistor, a fourth NMOS transistor and a fifth NMOS transistor; the first inverter chain includes an odd number of cascaded inverters;

A first input terminal of the first NAND gate is connected to a second control signal, a second input terminal of the first NAND gate is connected to a gating signal corresponding to the charging current mirror module, and an output terminal of the first NAND gate is connected via the first inverter chain to a drain of the ninth high voltage NMOS transistor and a gate of the tenth high voltage NMOS transistor; a rising edge of the second control signal is synchronized with the rising edge of the input signal of the segmented direct gate drive circuit; the second control signal is flipped to low when the gate voltage of the GaN power device is charged to the zero level;

A drain of the eighth high voltage PMOS transistor is connected to a drain of the tenth high voltage NMOS transistor and the gate of the tenth high voltage PMOS transistor, and is connected via the seventh resistor to a power supply voltage, a gate of the eighth high voltage PMOS transistor is connected to a gate of the ninth high voltage PMOS transistor and a source of the tenth high voltage PMOS transistor and is connected via the sixth resistor to the power supply voltage, and a source of the eighth high voltage PMOS transistor is connected to a source of the ninth high voltage PMOS transistor and the power supply voltage;

A drain of the fifth NMOS transistor is connected to the gate and the source of the ninth high voltage NMOS transistor and the source of the tenth high voltage NMOS transistor, a gate of the fifth NMOS transistor is connected to a gate and a drain of the fourth NMOS transistor and the adjustable current and is connected via the second capacitor to the ground level, and a source of the fifth NMOS transistor is connected to a source of the fourth NMOS transistor and the ground level;

The ninth resistor is connected between a drain of the tenth high voltage PMOS transistor and the ground level; a drain of the ninth high voltage PMOS transistor is connected to a gate and a drain of the fifteenth high voltage NMOS transistor;

The main charging path includes a sixteenth high voltage NMOS transistor; a width-to-length ratio of the sixteenth high voltage NMOS transistor is much larger than that of the fifteenth high voltage NMOS transistor;

A gate of the sixteenth high voltage NMOS transistor is connected to the gate and the drain of the fifteenth high voltage NMOS transistor, a drain of the sixteenth high voltage NMOS transistor is connected to the ground level, and a source of the sixteenth high voltage NMOS transistor is connected to a source of the fifteenth high voltage NMOS transistor and is used as an output terminal of the charging current mirror module to connect to the gate of the depletion mode GaN power device;

The discharge protection switching unit includes a second inverter chain and a seventeenth high voltage NMOS transistor; the second inverter chain includes an even number of cascaded inverters; an input terminal of the second inverter chain is connected to a fourth control signal, and an output terminal of the second inverter chain is connected to a gate of the seventeenth high voltage NMOS transistor;

The fourth control signal is flipped to a low level when the gate voltage of the depletion mode GaN power device starts to charge, and the fourth control signal is flipped to a high level when the gate voltage of the depletion mode GaN power device starts to discharge;

A drain of the seventeenth high voltage NMOS transistor is connected to the gate of the sixteenth high voltage NMOS transistor, and a source of the seventeenth high voltage NMOS transistor is connected to the negative voltage turn-off level;

The voltage clamp protection unit includes an eleventh high voltage NMOS transistor, a twelfth high voltage NMOS transistor, a thirteenth high voltage NMOS transistor, a fourteenth high voltage NMOS transistor and an eighth resistor, A gate and a source of the eleventh high voltage NMOS transistor are connected to one end of the eighth resistor, a source of the fourteenth high voltage NMOS transistor and the output terminal of the charging current mirror module, and a drain of the eleventh high voltage NMOS transistor is connected to a gate and a drain of the twelfth high voltage NMOS transistor, a drain of the fourteenth high voltage NMOS transistor and the gate of the sixteenth high voltage NMOS transistor;

A gate and a drain of the thirteenth high voltage NMOS transistor are connected to a source of the twelfth high voltage NMOS transistor, and a source of the thirteenth high voltage NMOS transistor is connected to a gate of the fourteenth high voltage NMOS transistor and the other end of the eighth resistor.

Specifically, the discharging module includes a discharge control logic unit and eight discharging paths; the discharge control logic unit is used for generating gating signals corresponding to each of the eight discharging paths under enablement of the fourth control signal;

The discharging path includes a drive unit and an eighteenth high voltage NMOS transistor; a drain end of the eighteenth high voltage NMOS transistor has a higher voltage resistance capability than that of high voltage switching transistors in the fast charging module, the current mirror charging module and the gate voltage holding module; the drive unit includes a second NAND gate and a third inverter chain; the third inverter chain includes an odd number of cascaded inverters; a first input terminal of the second NAND gate is connected to the fourth control signal, a second input terminal of the second NAND gate is connected to a gating signal corresponding to the discharging path, and an output terminal of the second NAND gate is connected via the third inverter chain to a gate of the eighteenth high voltage NMOS transistor; a drain of the eighteenth high voltage NMOS transistor is connected to the gate of the depletion mode GaN power device, and a source of the eighteenth high voltage NMOS transistor is connected to the negative voltage turn-off signal.

Specifically, the discharge control logic unit gates the eight discharging paths according to a fourth gating control signal and a fifth gating control signal; when both the fourth gating control signal and the fifth gating control signal are at a low level, one of the eight discharging paths is gated; when the fourth gating control signal is at a high level and the fifth gating control signal is at a low level, two of the eight discharging paths are gated; when the fourth gating control signal is at a low level and the fifth gating control signal is at a high level, four of the eight discharging paths are gated; when both the fourth gating control signal and the fifth gating control signal are at a high level, the eight discharging paths are gated; by controlling gating of the eight discharging paths, a turn-off delay of the GaN power device is matched with a turn-on delay of the GaN power device.

Specifically, the first current source includes a first NMOS transistor, a second NMOS transistor, a third NMOS transistor, a first high voltage NMOS transistor, a second high voltage NMOS transistor and a third high voltage NMOS transistor, A gate and a drain of the first high voltage NMOS transistor is short-circuited and connected to gates of the second high voltage NMOS transistor and the third high voltage NMOS transistor and the bias current, and the source of the first high voltage NMOS transistor is connected to a gate and a drain of the first NMOS transistor and gates of the second NMOS transistor and the third NMOS transistor;

A drain of the second high voltage NMOS transistor outputs the first mirror current, and a source of the second high voltage NMOS transistor is connected to a drain of the second NMOS transistor;

A drain of the third high voltage NMOS transistor outputs the second mirror current, and a source of the third high voltage NMOS transistor is connected to a drain of the third NMOS transistor;

Sources of the first NMOS transistor, the second NMOS transistor and the third NMOS transistor are connected to the negative voltage turn-off level;

The second current source includes a third PMOS transistor, a fourth PMOS transistor, a third high voltage PMOS transistor and a fourth high voltage PMOS transistor; a gate and a drain of the third high voltage PMOS transistor are short-circuited and connected to a gate of the fourth high voltage PMOS transistor and the second mirror current, and a source of the third high voltage PMOS transistor is connected to a gate and a drain of the third PMOS transistor and a gate of the fourth PMOS transistor;

A source of the fourth PMOS transistor is connected to a source of the third PMOS transistor, and a drain of the fourth PMOS transistor is connected to a source of the fourth high voltage PMOS transistor;

A drain of the fourth high voltage PMOS transistor outputs the third mirror current.

The beneficial effects of the present invention are: the segmented direct gate drive of a depletion mode GaN power device proposed by the present invention can be directly used to control the depletion mode GaN power device without controlling the gate of the Si MOSFET to further control the switching of the GaN; controllable segmented charging of the gate voltage of the GaN power devices can be obtained through the fast charging module and the current mirror charging module; voltage clamp protection and discharge protection are proposed to improve reliability of the circuit; the discharging module is proposed to match the turn-off delay and the turn-on delay of the GaN power device by gating different numbers of discharging paths.

DETAILED DESCRIPTION

The technical solutions of the present invention will be described in detail below with reference to the drawings and specific embodiments.

Figure 1:
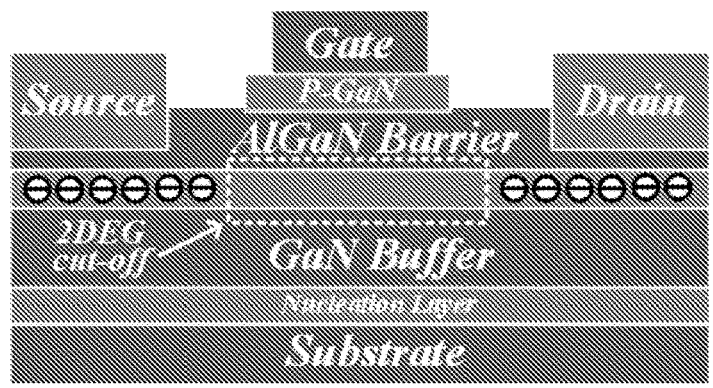
FIG. 1 is an example of the currently know high voltage GaN power device, in which (a-1) is a structural diagram of a p-GaN, (a-2) is a schematic diagram of the p-GaN device having Miller error turn on under a high dv/dt, and (b) is a structural diagram of a Cascode drive considering a parasitic capacitance and inductance.
Figure 1:
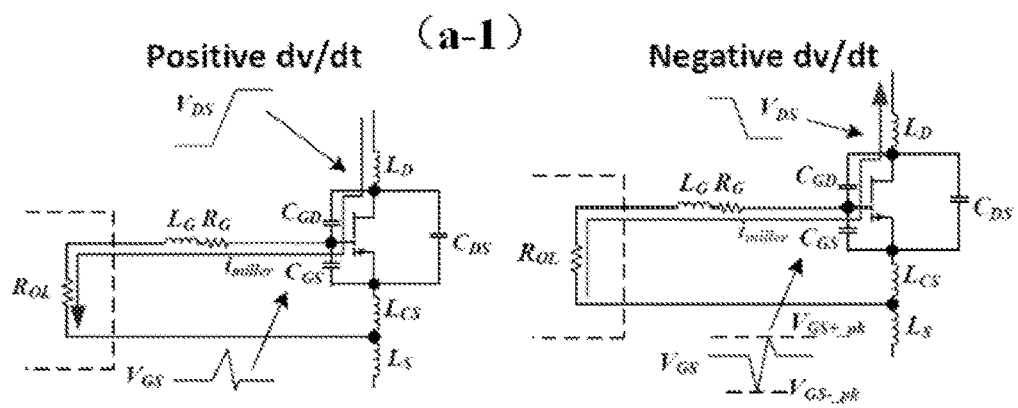
Figure 1:
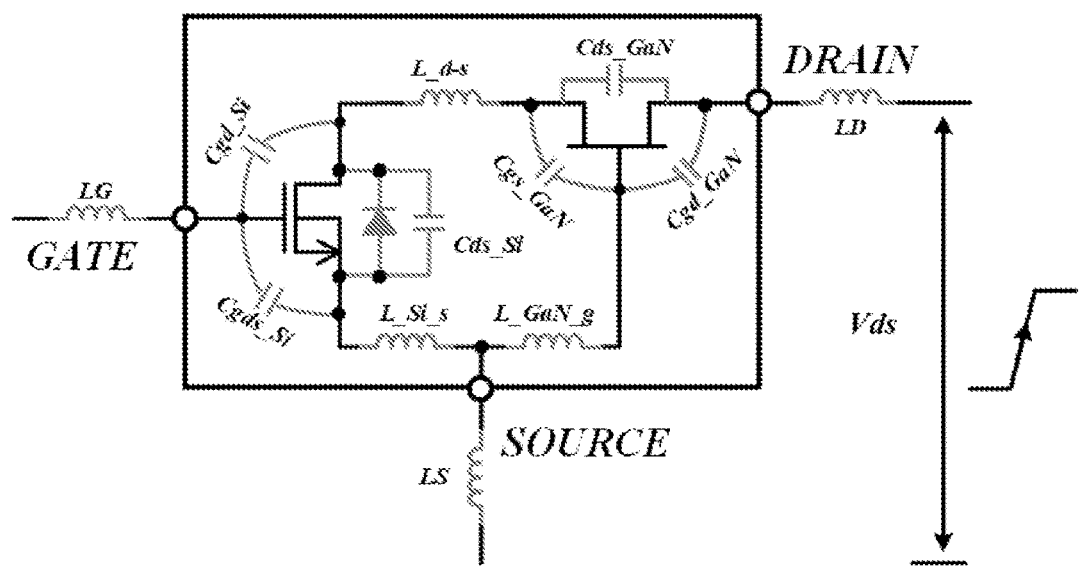
Figure 2:
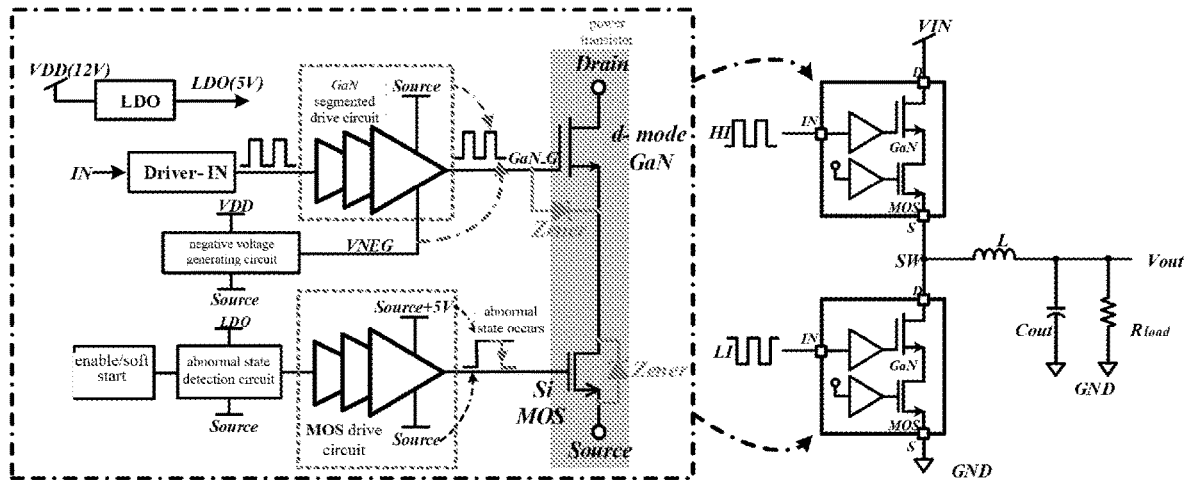
FIG. 2 is a schematic diagram of a power device connection configuration according to the present invention.

Because the depletion mode GaN has a normally-on characteristic, and has a negative threshold voltage ($V_{th}$) (typically −7−−8V) and a turn-on voltage ($V_{on}$) of 0V, it operates similarly to the Cascode-drive technology. As shown in FIG. 2, in the present invention, a low-voltage Si MOSFET is connected in series with the source of the depletion mode GaN power device to obtain a normally-off characteristic of a power level. The gate of the GaN power device is connected to the gate drive circuit according to the present invention, the drain of the GaN power device is connected to the input signal, and the source of the GaN power device is connected to the drain of the Si MOSFET. The gate of the Si MOSFET is connected to the drive circuit that drives the Si MOSFET, and the source of the Si MOSFET is grounded. Zener diodes (Zener transistors) are respectively provided between the Si MOSFET and the gate and the source of the GaN power device. Compared with the Cascode-drive configuration in the prior art, in which only the gate of the Si MOSFET is controlled to further control the switching of the GaN, the direct drive method proposed by the present invention can directly drive the gate of the GaN power device. In order to be compared with the Cascode-drive configuration in the prior art, this embodiment takes a scenario in which the depletion mode GaN power device is applied in series with a low voltage Si MOSFET as an example for illustration. However, those skilled in the art should understand that the gate drive solutions of the GaN power device proposed by the present invention are not merely applicable to the application scenario in which the GaN power device and the Si MOSFET are connected in series as shown in FIG. 2.

As shown in FIG. 2, before the circuit starts to establish, the GaN power device is in the on state, and the Si MOSFET is in the off state. When the circuit is established, an external high voltage is applied to the drain of the GaN. Since the GaN is in the on state, the voltage is also applied to the drain of the Si MOSFET. At this time, the Si MOSFET is in the off state, the Zener diodes (Zener transistors) across the drain and the source of the Si MOSFET are thus broken down. The drain voltage of the Si MOSFET is clamped at a fixed value, such as 13V, which can be adjusted according to actual applications, to ensure that the voltage difference between the gate and the source of the GaN is greater than the GaN threshold voltage $V_{th}$. At the same time, a negative voltage level VNEG is used to turn off the depletion mode GaN inside the circuit starts to establish through a negative voltage generating circuit. With the gradual establishment of the negative voltage, the gate-source voltage of the GaN increases. When the gate-source voltage reaches 16V, the Zener diodes (Zener transistors) across the gate and the source of the GaN will reach revers breakdown. At this time, the source potential of the GaN decreases with the gate potential. When the VNEG is established and the Si MOSFET is turned on, the GaN is in a completely off state, and then a PWM signal is sent to the gate of the GaN for normal switching. While operating in the linear region state, the Si MOSFET remains on, and a driving square wave generated by the GaN segmented direct gate driving circuit proposed by the present invention directly drives the depletion mode GaN. The turn-off level of the GaN, i.e., the negative voltage turn-off level VNEG, is a negative level lower than the GaN threshold voltage $V_{th}$, which is generated by the negative voltage generating circuit in the system.

From the background knowledge, it can be known that an enhancement mode GaN device has a problem of a low threshold voltage. In a high voltage application, if a driving method of zero voltage turn-off and positive voltage turn-on is used, the reliability will be greatly affected when the drain end of the device has a high dv/dt. In a driving strategy of negative voltage turn-off and zero voltage turn-on of the depletion mode GaN device, if the drain end of the device has a high slew rate of dv/dt, as long as the voltage spike dv/dt of the superimposed GaN gate voltages is less than the threshold voltage of the GaN device, it can be ensured that the GaN device will not be turned mistakenly, making the driving method of the negative voltage turn-off used more reliable than the traditional zero voltage turn-off. In addition, to optimize the turn-on speed of the GaN and the electromagnetic interference effect (EMI) during the turn-on process, a segmented turn-on strategy of the depletion mode GaN, in which the GaN turn-on process is divided into a plurality of stages by changing the gate drive current intensity, and the GaN turn-on performance is optimized at each stage. When applying the gate drive circuit of the depletion mode GaN power device to the depletion mode GaN power device in series with the Si MOSFET, if/when an abnormal condition (such as over temperature, over current, under voltage or the like) occurs, the Si MOSFET can be directly turned off by a MOS drive circuit. Through reverse blocking of the depletion mode GaN by the Si MOSFET, the turning-off of a power level can be implemented.

The working process and working principle of the segmented direct gate drive circuit of a depletion mode GaN power device in the present invention is described in detail below with reference to the accompanying drawings.

Figure 3:
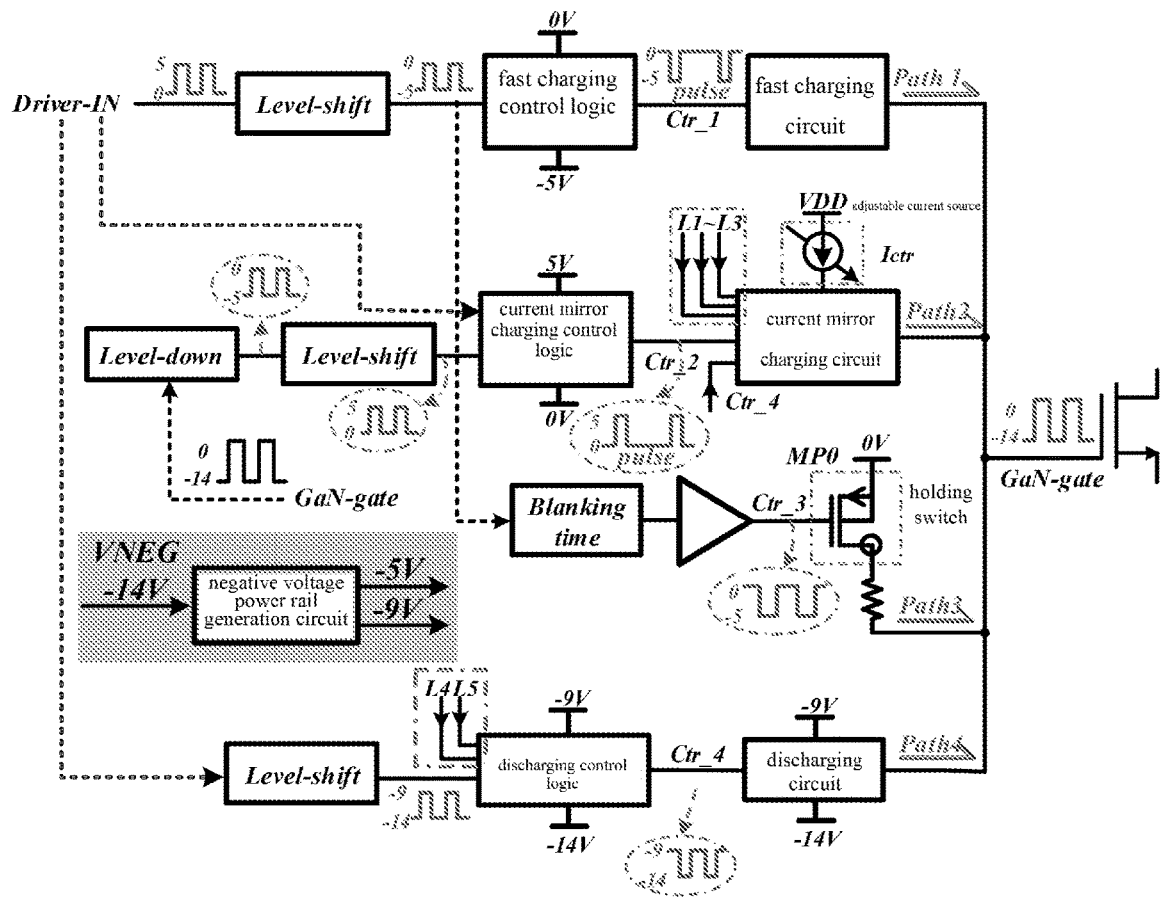
FIG. 3 is a block diagram of the architecture of the segmented direct gate drive circuit of a depletion mode GaN power device according to the present invention.

FIG. 3 shows the overall architecture diagram of the segmented direct gate drive circuit of a depletion mode GaN proposed by the present invention. The threshold voltage of the GaN device is generally about −8 V, and the lowest power rail of the circuit is the negative voltage turn-off level VNEG=−14 V for turning off the GaN generated by the negative voltage generating circuit in the system of FIG. 2. The input signal Driver-IN of the gate drive circuit is a PWM signal for a driving input, and the voltage amplitude in this embodiment is 0-5V. The main body of the segmented direct gate drive circuit proposed by the present invention is divided into four parts: a fast charging path (Path1), a current mirror charging path (Path2), a gate voltage holding path (Path3) and a discharging path (Path4). At the same time, the circuit also includes a negative voltage power rail generating circuit, which is used to generate two negative voltages of −5V and −9V as the power rails of key modules in the circuit.

Figure 5:
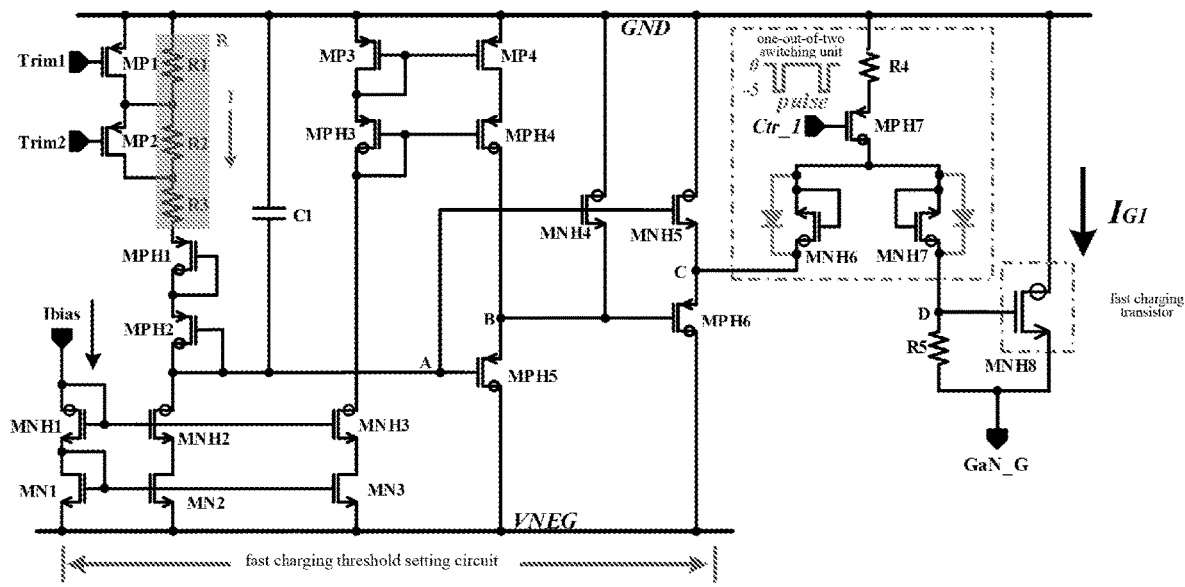
FIG. 5 is a circuit implementation diagram of a fast charging module in the segmented direct gate drive circuit of a depletion mode GaN power device according to the present invention.

Fast Charging Path (Path1):

In this stage, the fast charging module is used to charge the gate voltage of the GaN power device from the negative voltage turn-off level to the threshold voltage of the GaN power device. As shown in FIG. 5, the fast charging module includes a fast charging unit, a threshold setting unit and a one-out-of-two switching unit. The threshold setting unit includes an adjustable resistor, a first capacitor C1, a first current mirror unit, a second current mirror unit, a first high voltage PMOS transistor MPH1, a second high voltage PMOS transistor MPH2, a fifth high voltage PMOS transistor MPH5, a sixth high voltage PMOS transistor MPH6, a fourth high voltage NMOS transistor MNH4 and fifth high voltage NMOS transistor MNH5. The first current mirror unit is used to mirror the bias current Ibias to obtain a first mirror current and a second mirror current; one end of the adjustable resistor is grounded, and the other end is connected to a source of the first high voltage PMOS transistor MPH1; a source of the second high voltage PMOS transistor MPH2 is connected to a gate and a drain of the first high voltage PMOS transistor MPH1, and a gate and a drain of the second high voltage PMOS transistor are interconnected and connected to gates of the fifth high voltage PMOS transistor MPH5, the fourth high voltage NMOS transistor MNH4 and the fifth high voltage NMOS transistor MNH5 and the first mirror current, and are connected via the first capacitor C1 to a ground voltage GND of 0V; the second current mirror unit is used to mirror the second mirror current to obtain a third mirror current; a gate of the sixth high voltage PMOS transistor MPH6 is connected to sources of the fifth high voltage PMOS transistor MPH5 and the fourth high voltage NMOS transistor MNH4 and the third mirror current, a source of the sixth high voltage PMOS transistor is connected to the source of the fifth high voltage NMOS transistor MNH5 and is used as an output terminal of the threshold setting unit, and a drain of the sixth high voltage PMOS transistor is connected to a drain of the fifth high voltage PMOS transistor MPH5 and the negative voltage turn-off level VNEG; drains of the fourth high voltage NMOS transistor MNH4 and the fifth high voltage NMOS transistor MNH5 are connected to the ground voltage GND. The one-out-of-two switching unit comprise a fourth resistor R4, a seventh high voltage PMOS transistor MPH7, a sixth high voltage NMOS transistor MNH6 and a seventh high voltage NMOS transistor MNH7; a gate of the seventh high voltage PMOS transistor MPH7 is connected to a first control signal Ctr_1, a source of the seventh high voltage PMOS transistor is connected via the fourth resistor R4 to the ground voltage, and a drain of the seventh high voltage PMOS transistor is connected to a gate and a drain of the sixth high voltage NMOS transistor, and a gate and a drain of the seventh high voltage NMOS transistor; the first control signal is a short pulse signal, a rising edge of which is triggered by a rising edge of an input signal of the segmented direct gate drive circuit; the drain of the sixth high voltage NMOS transistor is used as a first selection terminal of the one-out-of-two switching unit to connect to the output terminal of the threshold setting unit, and the drain of the seventh high voltage NMOS transistor is used as a second selection terminal of the one-out-of-two switching unit. The fast charging unit includes a fifth resistor and an eighth high voltage NMOS transistor; a gate of the eighth high voltage NMOS transistor is connected to the second selection terminal of the one-out-of-two switching unit and one end of the fifth resistor, a drain of the eighth high voltage NMOS transistor is connected to the ground voltage, and a source of the eighth high voltage NMOS transistor is connected to the other end of the fifth resistor and is used as an output terminal of the fast charging module to connect to a gate of the depletion mode GaN power device.

FIG. 5 shows an implementation of the adjustable resistor. The adjustable resistor includes a first PMOS transistor MP1, a second PMOS transistor MP2, a first resistor R1, a second resistor R2 and a third resistor R3; a gate of the first PMOS transistor MP1 is connected to a first trim control signal Trim1, a source of the first PMOS transistor is connected to one end of the first resistor R1 and the ground voltage GND, and a drain of the first PMOS transistor is connected to the other end of the first resistor R1; a gate of the second PMOS transistor MP2 is connected to a second trim control signal Trim2, a source of the second PMOS transistor is connected to one end of the second resistor R2 and the drain of the first PMOS transistor MP1, and a drain of the second PMOS transistor is connected to the other end of the second resistor R2 and connected via the third resistor R3 to the source of the first high voltage PMOS transistor MPH1. The number of Trim resistors can also be changed to obtain a larger range of adjustment.

As shown in FIG. 5, the first current source includes a first NMOS transistor MN1, a second NMOS transistor MN2, a third NMOS transistor MN3, a first high voltage NMOS transistor MNH1, a second high voltage NMOS transistor MNH2 and a third high voltage NMOS transistor MNH3; a gate and a drain of the first high voltage NMOS transistor MNH1 is short-circuited and connected to gates of the second high voltage NMOS transistor MNH2 and the third high voltage NMOS transistor MNH3 and the bias current Ibias, and the source of the first high voltage NMOS transistor is connected to a gate and a drain of the first NMOS transistor MN1 and gates of the second NMOS transistor MN2 and the third NMOS transistor MN3; a drain of the second high voltage NMOS transistor MNH2 outputs the first mirror current, and a source of the second high voltage NMOS transistor is connected to a drain of the second NMOS transistor MN2; a drain of the third high voltage NMOS transistor MNH3 outputs the second mirror current, and a source of the third high voltage NMOS transistor is connected to a drain of the third NMOS transistor MN3; sources of the first NMOS transistor MN1, the second NMOS transistor MN2 and the third NMOS transistor MN3 are connected to the negative voltage turn-off level VNEG. The second current source includes a third PMOS transistor MP3, a fourth PMOS transistor MP4, a third high voltage PMOS transistor MPH3 and a fourth high voltage PMOS transistor MPH4; a gate and a drain of the third high voltage PMOS transistor MPH3 are short-circuited and connected to a gate of the fourth high voltage PMOS transistor MPH4 and the second mirror current, and a source of the third high voltage PMOS transistor is connected to a gate and a drain of the third PMOS transistor MP3 and a gate of the fourth PMOS transistor MP4; a source of the fourth PMOS transistor MP4 is connected to a source of the third PMOS transistor MP3, and a drain of the fourth PMOS transistor is connected to a source of the fourth high voltage PMOS transistor MPH4; a drain of the fourth high voltage PMOS transistor MPH4 outputs the third mirror current. The first current source is used to mirror the bias current Ibias to provide a bias for a subsequent structure. In this embodiment, the Cascode current mirror structure is used, which can also be replaced with other current mirror structures.

The working principle of the fast charging path (Path1) is as follows.

Figure 4:
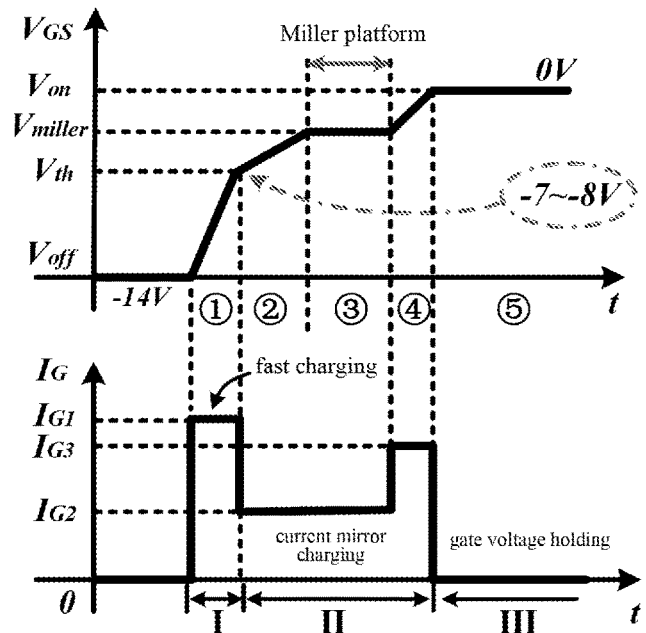
FIG. 4 is a waveform diagram of the gate drive voltage and the gate drive current of the segmented direct gate drive circuit of a depletion mode GaN power device during the turn-on process of the GaN power device according to the present invention.

In the present invention, the negative voltage of the negative voltage turn-off level VNEG=−14V directly turns off the GaN power device. The voltage difference of 6 V between the gate level VNEG=−14V and the threshold voltage $V_{th}$=−8V of the GaN power device in the off state can greatly improve the dv/dt immunity ability of the device gate. However, during the turn-on process of the device, the period of charging from the negative voltage turn-off level VNEG to the threshold voltage $V_{th}$ is an unnecessary turn-on delay for the system, so this period of charging should be minimized. As shown in the fast charging path (Path1) in FIG. 3, the fast charging module designed in the present invention uses a large current to charge the gate of the GaN power device. At this stage, the device channel has not been formed, and the device has no switching action, so there is no problem related with the di/dt and the dv/dt caused by excessive driving strength. The waveforms of the gate drive voltage (stage ①) and the drive current (stage I) at this stage are shown in FIG. 4. The turn-on delay $t_1$ brought by stage ① can be calculated by the following formula:

$$Q_{gs1} = C_{gs1}(V_{th} - VNEG) \tag{1}$$

$$t_1 = \frac{Q_{gs1}}{I_g} \tag{2}$$

Wherein $C_{gs1}$ is the gate-source parasitic capacitance of the GaN power device, $Q_{gs1}$ is the gate-source charge, and $I_g$ is the magnitude of the gate drive current at stage I.

Figure 8:
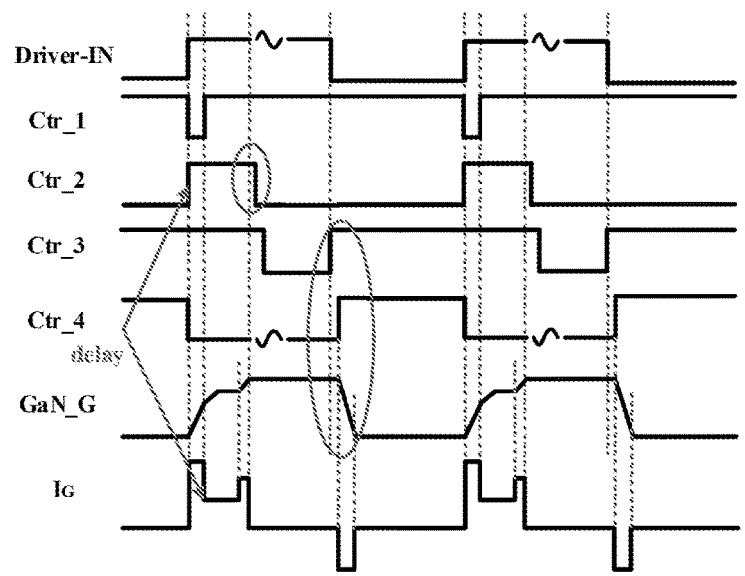
FIG. 8 is a waveform diagram of key signals in the segmented direct gate drive circuit of a depletion mode GaN power device according to the present invention.

The fast charging module includes a one-out-of-two switching unit, a threshold setting unit and a fast charging unit. In the one-out-of-two switching unit, the seventh high voltage PMOS transistor MPH7 is turned on under control of the first control signal Ctr_1. The first control signal Ctr_1 is a short pulse signal, which is triggered by the Driver-IN, and the pulse width design of which is required to be greater than $t_1$ to ensure that the gate voltage of the GaN power device is charged to the threshold voltage $V_{th}$, as shown in FIG. 8. The sixth high voltage NMOS transistor MNH6 and the seventh high voltage NMOS transistor MNH7 short-circuited at the gate and the source constitute two parasitic body diodes, which are respectively connected to the threshold voltage $V_C$ preset by the threshold setting unit and the main charging transistor in the fast charging unit, i.e., the gate voltage $V_D$ of the eighth high voltage NMOS transistor MNH8. A source of the eighth high voltage NMOS transistor MNH8 is connected to the gate of the GaN power device and is used as a fast charging path to charge the gate voltage of the GaN power device. The one-out-of-two switching unit gates a branch with a lower voltage by comparing voltage magnitudes of $V_C$ and $V_D$, so as to determine the termination voltage of the gate of the GaN power device during the fast charging stage. The $V_C$ is determined by the threshold setting unit, and its expression is shown in formula (3):

$$V_C = V_{GND} - I \cdot R - V_{gs,MPH1} - V_{gs,MPH2} + V_{gs,MPH5} + V_{gs,MPH6} \tag{3}$$

Wherein R refers to the resistance value of the adjustable resistor. In this embodiment, the first resistor R1, the second resistor R2 and the third resistor R3 are controlled by a trimming signal to adjust the adjustable resistor. I is the current flowing through the adjustable resistor. Through a reasonable design, the magnitude of $V_C$ approximates to the voltage drop on the adjustable resistor R. When $V_{GaNC\_G} < V_C$, the body diode of the seventh high voltage NMOS transistor MNH7 is conducted, the main charging transistor, i.e., the eighth high voltage NMOS transistor MNH8, is turned on, and the main charging transistor provides the driving current for the gate GaN_G of the GaN power device; as $V_{GaN\_G}$ rises, when the voltage at point D is higher than the voltage at point C, the body diode of the sixth high voltage NMOS transistor MNH6 is conducted, and the seventh high voltage NMOS transistor MNH7 is reversely turned off. Since there is no current passing through the third resistor R3 at this time, the gate-source parasitic capacitance of the eighth high voltage NMOS transistor MNH8 is discharged via the third resistor R3, causing its gate-source voltage Vgs to gradually decrease until it is turned off, that is, the fast charging path stops working.

The voltage $V_C$ determines the level $V_{GaN\_G1}$ that the gate of the GaN power device can finally reach at the fast charging stage, $$V_{GaN\_G1} \approx V_C - V_{th,MNH8} \quad (4)$$

It can be seen from formulas (3) and (4) that the GaN gate voltage at the end of the fast charging stage can be changed by modifying the resistance value of the adjustable resistor. In this embodiment, a trim is added to switch the first PMOS transistor MP1 and the second PMSO transistor MP2 to ensure accuracy of the gate termination voltage of the GaN at stage ①, that is, $V_{GaN\_G1} \approx V_{th\_GaN}$.

Figure 6:
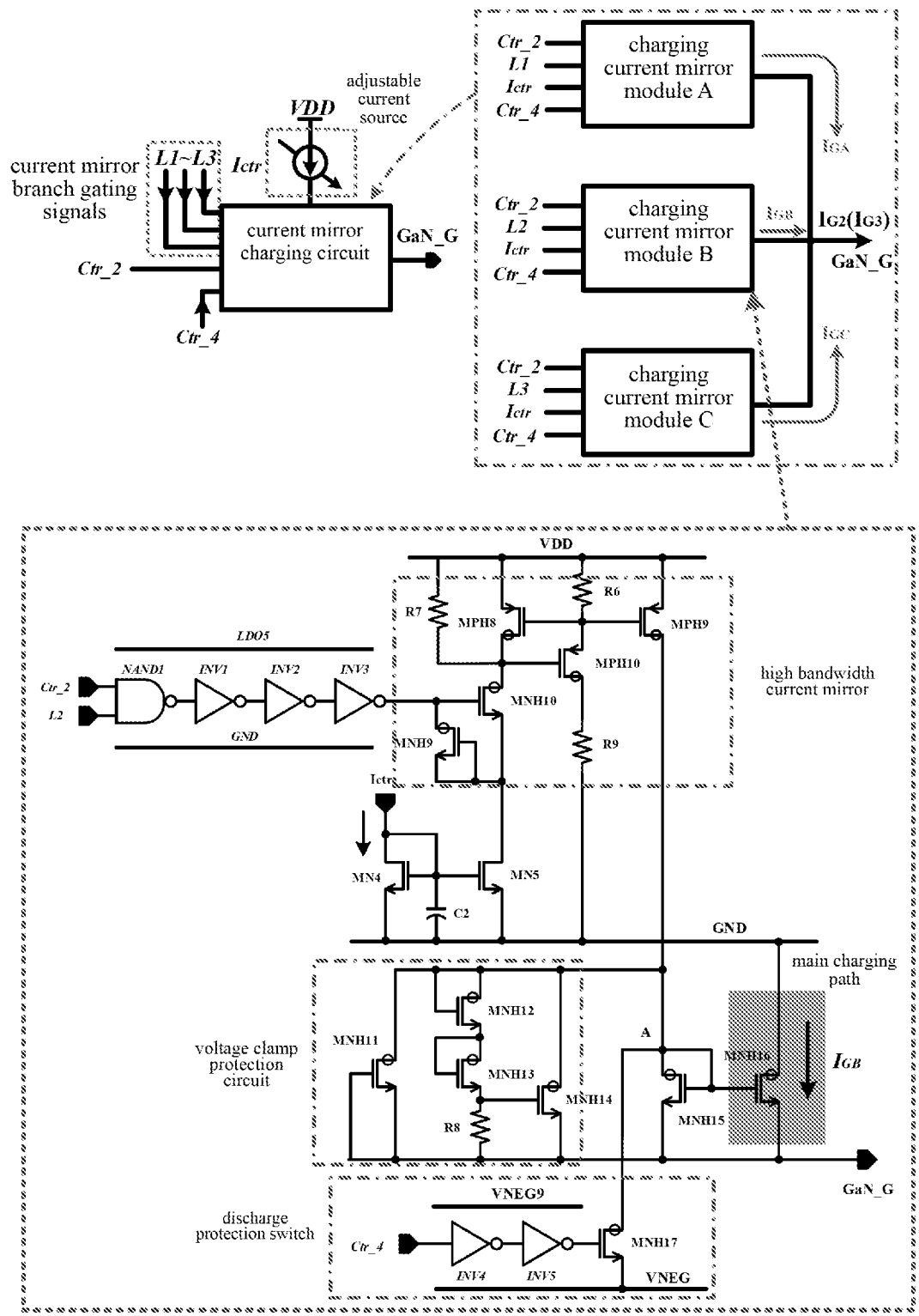
FIG. 6 is a circuit implementation diagram of a current mirror charging module in the segmented direct gate drive circuit of a depletion mode GaN power device according to the present invention.

Current Mirror Charging Path (Path2):

In the fast charging stage, the gate-source voltage of the GaN power device is charged to approximate to the threshold voltage $V_{th}$ of the GaN power device. According to the physical mechanism of the turn-on process of the power device, after the gate-source voltage $V_{GS}$ exceeds the threshold voltage $V_{th}$, the device channel is considered to be conducted, then $V_{GS}$ will enter the Miller Plateau and remain at the Miller voltage $V_{miller}$, and finally rise to the turn-on voltage Von of the GaN power device, as shown in stages ②-④ in FIG. 4. During phases ② and ③, the drain current IDS of the GaN power device increases and the drain-source voltage $V_{DS}$ decreases. The power level under high speed switching will generate high di/dt and dv/dt, which is more serious in high voltage applications above 400 V. Therefore, it is necessary to reduce the charging intensity of the drive circuit at stages ②-③ to reasonably extend the time of stages ②-③ and reduce the di/dt and dv/dt peaks of the power level. There is no di/dt and dv/dt influence at stage ④, so the gate drive current can be enhanced again and the charging time of stage ④ can be reduced. Therefore, the present invention proposes a current mirror charging path (Path2) as shown in FIG. 3 to charge the gate voltage of the GaN power device at stages ②-③, and a current mirror charging module is designed to provide stable low current charging for the gate of the GaN power device. As shown in FIG. 6, the current mirror charging module includes N charging current mirror modules, where N is a positive integer greater than 1. In this embodiment, N is assumed to be 3 for illustration, and the three charging current mirror modules (i.e., the charging current mirror modules A, B and C) are respectively used to mirror the adjustable current Ictr under control of their corresponding gating signals (L1, L2 and L3 as shown in FIG. 6); each of the charging current mirror modules mirror the adjustable current Ictr when its corresponding gating signal is valid, otherwise an output current value is zero; the currents mirrored by the three charging current mirror modules are collectively used to charge the gate voltage of the GaN power device; when the fast charging module charges the gate voltage of the GaN power device to the threshold voltage of the GaN power device, less than N (in this embodiment, one or two may be first turned on) of the charging current mirror modules are first turned on to charge the gate voltage of the GaN power device from the threshold voltage of the GaN power device to a Miller platform voltage of the GaN power device, and then the three charging current mirror modules are turned on to charge the gate voltage of the GaN power device from the Miller platform voltage of the GaN power device to the zero level (i.e., the turn-on voltage of the GaN power device).

As shown in FIG. 6, an adjustable current source generates an adjustable current Ictr. In this embodiment, three identical current mirror modules are designed inside the current mirror charging module to mirror the adjustable currents Ictr, which together serve as the gate drive current of the GaN power device. The current mirror can be gated by switching. By adjusting the magnitude of the adjustable current Ictr and the number of the charging current mirror modules that are turned on, the magnitude of final output current of the current mirror charging module can be changed, thereby controlling the dv/dt of the power level. The waveforms of the gate drive voltage (stages ②-④) and the drive current (stage II) of the GaN power device at this stage are shown in FIG. 4.

As shown in FIG. 6, a specific implementation of the charging current mirror module is provided, which includes a high bandwidth current mirror unit, a main charging path, a voltage clamp protection unit and a discharge protection switching unit. The high bandwidth current mirror unit includes a first NAND gate NAND1, a first inverter chain, a sixth resistor R6, a seventh resistor R7, a ninth resistor R9, a second capacitor C2, an eighth high voltage PMOS transistor MPH8, a ninth high voltage PMOS transistor MPH9, a tenth high voltage PMOS transistor MPH10, a ninth high voltage NMOS transistor MNH9, a tenth high voltage NMOS transistor MNH10, a fifteenth high voltage NMOS transistor MNH15, a fourth NMOS transistor MN4 and a fifth NMOS transistor MN5; the first inverter chain includes an odd number of cascaded inverters, for example, three inverters INV1, INV2 and INV3 constitute the first inverter chain; a first input terminal of the first NAND gate NAND1 is connected to a second control signal Ctr_2, a second input terminal of the first NAND gate is connected to a gating signal corresponding to the charging current mirror module (as shown in FIG. 6, the gating signal L2 corresponds to the charging current mirror module B), and an output terminal of the first NAND gate is connected via the first inverter chain to a drain of the ninth high voltage NMOS transistor MNH9 and a gate of the tenth high voltage NMOS transistor MNH10; a drain of the eighth high voltage PMOS transistor MPH8 is connected to a drain of the tenth high voltage NMOS transistor MNH10 and the gate of the tenth high voltage PMOS transistor MPH10, and is connected via the seventh resistor R7 to a power supply voltage VDD, a gate of the eighth high voltage PMOS transistor is connected to a gate of the ninth high voltage PMOS transistor MPH9 and a source of the tenth high voltage PMOS transistor MPH10 and is connected via the sixth resistor R6 to the power supply voltage VDD, and a source of the eighth high voltage PMOS transistor is connected to a source of the ninth high voltage PMOS transistor MPH9 and the power supply voltage VDD; a drain of the fifth NMOS transistor MN5 is connected to the gate and the source of the ninth high voltage NMOS transistor MNH9 and the source of the tenth high voltage NMOS transistor MNH10, a gate of the fifth NMOS transistor is connected to a gate and a drain of the fourth NMOS transistor MN4 and the adjustable current Ictr and is connected via the second capacitor C2 to the ground level GND, and a source of the fifth NMOS transistor is connected to a source of the fourth NMOS transistor MN4 and the ground level GND; the ninth resistor R9 is connected between a drain of the tenth high voltage PMOS transistor MPH10 and the ground level GND; a drain of the ninth high voltage PMOS transistor MPH9 is connected to a gate and a drain of the fifteenth high voltage NMOS transistor MNH15. The main charging path includes a sixteenth high voltage NMOS transistor MNH16; a gate of the sixteenth high voltage NMOS transistor is connected to the gate and the drain of the fifteenth high voltage NMOS transistor MNH15, a drain of the sixteenth high voltage NMOS transistor is connected to the ground level GND, and a source of the sixteenth high voltage NMOS transistor is connected to a source of the fifteenth high voltage NMOS transistor MNH15 and is used as an output terminal of the charging current mirror module to connect to the gate of the depletion mode GaN power device; a width-to-length ratio of the sixteenth high voltage NMOS transistor MNH16 is much larger than that of the fifteenth high voltage NMOS transistor MNH15, so that the gate voltage of the GaN power device is mainly charged by the current passing through the sixteenth high-voltage NMOS transistor MNH16. The discharge protection switching unit includes a second inverter chain and a seventeenth high voltage NMOS transistor MNH17; the second inverter chain includes an even number of cascaded inverters; an input terminal of the second inverter chain is connected to a fourth control signal Ctr_4, and an output terminal of the second inverter chain is connected to a gate of the seventeenth high voltage NMOS transistor MNH17; a drain of the seventeenth high voltage NMOS transistor MNH17 is connected to the gate of the sixteenth high voltage NMOS transistor, and a source of the seventeenth high voltage NMOS transistor is connected to the negative voltage turn-off level, as shown in FIG. 8; the fourth control signal Ctr_4 is flipped to a low level when the gate voltage of the depletion mode GaN power device starts to charge, and the fourth control signal Ctr_4 is flipped to a high level when the gate voltage of the depletion mode GaN power device starts to discharge. The voltage clamp protection unit includes an eleventh high voltage NMOS transistor MNH11, a twelfth high voltage NMOS transistor MNH12, a thirteenth high voltage NMOS transistor MNH13, a fourteenth high voltage NMOS transistor MNH14 and an eighth resistor R8; the number of the twelfth high voltage NMOS transistor MNH12 and the thirteenth high voltage NMOS transistor MNH13 of the diode connection can also be adjusted appropriately; a gate and a source of the eleventh high voltage NMOS transistor MNH11 are connected to one end of the eighth resistor R8, a source of the fourteenth high voltage NMOS transistor MNH14 and the output terminal of the charging current mirror module, and a drain of the eleventh high voltage NMOS transistor is connected to a gate and a drain of the twelfth high voltage NMOS transistor MNH12, a drain of the fourteenth high voltage NMOS transistor MNH14 and the gate of the sixteenth high voltage NMOS transistor; a gate and a drain of the thirteenth high voltage NMOS transistor MNH13 are connected to a source of the twelfth high voltage NMOS transistor MNH12, and a source of the thirteenth high voltage NMOS transistor is connected to a gate of the fourteenth high voltage NMOS transistor MNH14 and the other end of the eighth resistor R8.

In this embodiment, the current mirror charging module is composed of three charging current mirror modules A, B and C having the same structure. Each of the charging current mirror modules is controlled by their corresponding gating signals L1, L2 and L3. These charging current mirror modules collectively mirror the adjustable current $I_{ctr}$. The sum of the mirror currents of the three modules is the final charging current of the current mirror charging circuit, that is:

$$I_{G2}(I_{G3}) = I_{GA} + I_{GB} + I_{GC} \tag{5}$$

At stages ② and ③, one or two charging current mirror modules can be selected to be turned on to provide a low charging current for the gate of the GaN power device; at stage ④, three charging current mirror modules are turned on to provide a large charging current for the gate of the GaN power device.

The second control signal Ctr_2 is used as a control signal of the overall current mirror charging module. As shown in FIG. 8, a rising edge of the second control signal Ctr_2 is synchronized with the rising edge of the input signal Driver_IN of the segmented direct gate drive circuit. As shown in FIG. 3, the gate signal GaN-gate of the GaN power device is fed back to the Level-down, and then sent to the current mirror control logic circuit after a logic level conversion to generate a falling edge of the second control signal Ctr_2. Therefore, the second control signal is flipped to low after the gate voltage of the GaN power device is charged to the zero level. L1-L3 are the gating signals of the three charging current mirror modules, respectively, and the magnitude of the charging current can be changed by selecting the number of the modules to be turned on through a logic design. When Ctr_2 and L2 are high at the same time, the charging current mirror module B starts to work. A high bandwidth current mirror is used in the circuit to meet the requirements of the high speed switching of the current mirror and reduce the response delay caused by the current mirror start-up. The main charging circuit is the sixteenth high voltage NMOS transistor MNH16, which serves as the last level of current mirror to provide a stable current to charge the gate of the GaN power device. Finally, the gate voltage GaN_G of the GaN power device can be charged to the ground level GND. At this time, the sixteenth high voltage NMOS transistor MNH16 enters a deep linear region and no longer mirrors the current, the charging path can thus be shut down adaptively.

The fourth control signal Ctr_4 is a discharging signal, which controls the discharge protection switching unit in the discharge module and the charging current mirror module. At the stage of charging the gate of the GaN power device, the fourth control signal Ctr_4=0, the seventeenth high voltage NMOS transistor MNH17 is turned off, and the main charging path normally mirrors the current. At the stage of discharging the gate of the GaN power device, the second control signal Ctr_2=0 turns off the mirror path of the high bandwidth current mirror. At this time, at Point A in FIG. 6, the gate of the sixteenth high voltage NMOS transistor MNH16 is in a high impedance state and is susceptible to noise crosstalk, which may cause the sixteenth high voltage NMOS transistor MNH16 to be turned on by mistake. Therefore, the main charging path is required to add a switch controlled by the discharging signal, so as to ensure that the charging path is completely shut down at the discharging stage. At the discharging stage, the fourth control signal Ctr_4=1, the seventeenth high voltage NMOS transistor MNH17 is turned on, and Point A is pulled to the negative voltage turn-off level VNEG. At this time, the gate signal GaN_G of the GaN power device is also discharged to VNEG by the discharge circuit, so the fifteenth high voltage NMOS transistor MNH15 and the sixteenth high voltage NMOS transistor MNH16 can remain being turned off all the time without the risk of the charging path being opening by mistake. Considering the speed at which the seventeenth high voltage NMOS transistor MNH17 pulls down the voltage at Point A to VNEG and the speed at which GaN_G is discharged to VNEG at the discharging stage are different, there may be a risk of the fifteenth high voltage NMOS transistor MNH15 suffering drain-source voltage resistance breakdown in a high resistance state. Therefore, a voltage clamp protection unit is designed to clamp the maximum drain-source voltage of the fifteenth high voltage NMOS transistor MNH15 to $V_{clamp}=V_{th,MNH12}+V_{th,MNH13}+V_{th,MNH14}\approx 3V_{th}$, so as to prevent the fifteenth high voltage NMOS transistor MNH15 from suffering drain-source breakdown.

At the stage of charging the current mirror, the gate of the GaN power device can be eventually charged to about 0V, i.e., the turn-on voltage Von of the depletion mode GaN. In order to reduce static power consumption of a branch of the current mirror, the current mirror charging module is required to be turned off in the circuit logic design, so that it no longer mirrors the adjustable current $I_{ctr}$. As shown in FIG. 2, the level-down circuit is designed to convert the −14V~0V square wave of the gate of the GaN power device into a −5V~0V square wave. When the gate voltage of the GaN power device is lower than −5V, the output voltage is always −5V; and when the gate voltage of the GaN power device is higher than −5V, the output voltage is equal to the gate voltage of the GaN power device and follows its change. When the gate voltage of the GaN power device reaches about 0V, that is, the sixteenth high voltage NMOS transistor MNH16 has entered the deep linear region, the charging path is shut down. At this time, the second control signal Ctr_2 for controlling the current mirror charging module should be turned off. Therefore, the rising edge of the second control signal Ctr_2 is determined by the rising edge of the input signal Driver-IN, and its falling edge is determined when the GaN gate is equal to 0V.

Gate Voltage Holding Path (Path3):

The gate level of the GaN power device is about 0V at the end of the stage of charging the current mirror. During the time period after the current mirror charging module is turned off and before the gate discharging signal of the GaN power device arrives, the gate of the GaN power device are in the high impedance state since there is no low impedance path connected to other potentials. A high impedance node is susceptible to noise crosstalk, which will cause problems related to system reliability. As shown in Path3 in FIG. 3, a gate voltage holding module is designed. FIG. 3 shows an implementation of the gate voltage holding module, which includes an eleventh high voltage PMOS transistor MP0 and a tenth resistor; a gate of the eleventh high voltage PMOS transistor MP0 is connected to a third control signal Ctr_3, a source of the eleventh high voltage PMOS transistor is connected to the ground voltage GND, and a drain of the eleventh high voltage PMOS transistor is connected via the tenth resistor to the gate of the depletion mode GaN power device. The third control signal is flipped to low when the gate voltage of the GaN power device is charged to the zero level and is flipped to high when the gate voltage of the GaN power device starts to discharge. In this embodiment, after the stage of charging the current mirror, a holding switch, i.e., the eleventh high voltage PMOS transistor MP0, is used to clamp the gate of the GaN power device at 0V, thereby providing a low resistance path for the gate of the GaN power device, and greatly reducing the influence of the crosstalk noise. Since the drain-source voltage of MP0 is approximately 0V at this time, the state of the holding switch is equivalent to that the zero-voltage switch ZVS is turned on, and the switching loss is low.

Charging Path (Path4):

The invention designs a discharging module for discharging the gate voltage of the GaN power device, so that the gate voltage of the GaN power device is discharged from the zero level to the negative voltage shut-off level. Since the segmented direct gate drive circuit designed in the present invention causes the change of the rising slope of the gate voltage when the power transistor is turned on due to the change of the gate drive strength, the turn-on delay of the power transistor will change. At this time, if the discharge intensity is fixed when the gate of the power transistor is turned off, that is, the turn-off delay is fixed, the switching delay matching of the power level is very poor, and thus there are difficulties in designing the dead time. Therefore, it is necessary to select different discharge intensities for the turn-on delay under different charging intensities and change the turn-off delay to match the switching delay. The discharge module proposed by the present invention includes M discharging paths, where M is a positive integer greater than 1, and the discharging speed of the gate voltage of the GaN power device is adjusted by controlling the gating of the M discharging paths.

Figure 7:
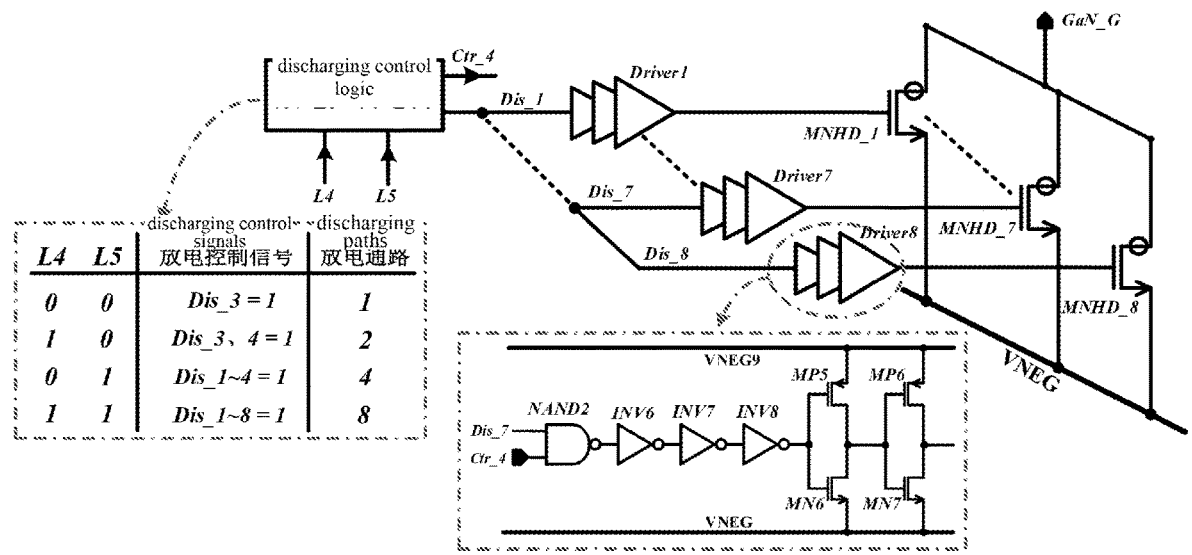
FIG. 7 is a circuit implementation diagram of a discharging module in the segmented direct gate drive circuit of a depletion mode GaN power device according to the present invention.

FIG. 7 shows an implementation of the discharging module. In this embodiment, the discharging module is designed as having an array type discharging structure and 8 identical discharging paths. Each discharging path includes a drive unit and a discharge transistor, i.e., the eighteenth high voltage NMOS transistor. Both the high voltage NMOS transistor and the high voltage PMOS transistor used in the present invention can be an LDMOS transistor, but the drain end voltage resistance capability of the eighteenth high voltage NMOS transistor is required to be higher than that of the high voltage switching transistors in the fast charging module, the current mirror charging module and the gate voltage holding module; for example, the high voltage switching transistors in the fast charging module, the current mirror charging module and the gate voltage holding module are selected as an LDMOS transistor with a highest drain-source voltage of 24V, and the eighteenth high voltage NMOS transistor in the discharging path is selected as an LDMOS transistor with a highest drain-source voltage of 40V. The drive unit includes a second NAND gate NAND2 and a third inverter chain; the third inverter chain includes an odd number of cascaded inverters; a first input terminal of the second NAND gate NAND2 is connected to the fourth control signal Ctr_4, a second input terminal of the second NAND gate is connected to a gating signal corresponding to the discharging path, and an output terminal of the second NAND gate is connected via the third inverter chain to a gate of the eighteenth high voltage NMOS transistor; a drain of the eighteenth high voltage NMOS transistor is connected to the gate of the depletion mode GaN power device, and a source of the eighteenth high voltage NMOS transistor is connected to the negative voltage turn-off signal VNEG.

In this embodiment, MNHD_1-MNHD_8 are discharge transistors respectively corresponding to 8 discharging paths, which are driven step by step by a Driver composed of inverter chains. The eight discharging paths are gated under control of the discharge control logic signals Dis_1 to Dis_8. The fourth control signal Ctr_4 is an enable signal of all discharging paths, which is opposite to the input signal Driver-IN. It always remains at 0 during the turn-on process of the GaN power device to keep the discharging path shut down and remains at 1 when the GaN power device is turned off to open the discharging path. The fourth gating control signal L4 and the fifth gating control signal L5 are logically combined to generate discharge control logic signals Dis_1-Dis_8, which are used as the gating signals of the discharging path, as shown in the truth table in FIG. 6. The discharge circuit can generate a total of four discharge intensities: 1 discharging path/2 discharging paths/4 discharging paths/8 discharging paths, thereby changing the turn-off delay and matching the turn-on delay of the power transistor.

FIG. 8 shows the key signal waveforms of the segmented direct gate drive of the present invention, wherein both the first control signal Ctr_1 used for opening the fast charging path and the second control signal Ctr_2 used for turning on the current mirror charging are synchronized with the rising edge of the input signal Driver-IN. However, due to the startup time of the current mirror in the current mirror charging module, there is a delay between the generation time of the current mirror charging current and the second control signal Ctr_2, and this delay can be selected as the fast charging time. In an actual design, the turn-off point (falling edge of the second control signal Ctr_2) of the current mirror charging stage is required to be slightly delayed from the time when the gate of the GaN power device reaches 0V to ensure that the GaN gate can be fully charged to 0V. In an actual design, the starting point of the discharging stage (the rising edge of the fourth control signal Ctr_4) is required to delay the turn-off point of the holding switch (the rising edge of the third control signal Ctr_3) to ensure that the holding switch MP0 is completely turned off before opening the discharging path, so as to avoid punch-through between the power rails of the ground level GND and the negative voltage turn-off level VNEG.

In summary, the present invention provides a segmented direct gate drive circuit for depletion mode GaN power devices. In the fast charging module, a threshold setting unit is combined with a one-out-of-two switching unit, so that when the fast charging module charges the gate voltage of the GaN power device, it can stop charging near the threshold voltage of the GaN power device, and when charging to the threshold voltage, the circuit stops charging the gate of the GaN power device via the one-out-of-two switching unit. The current mirror charging module adjusts the number of the charging current mirror modules as required to control the charging intensity, and the designed high bandwidth current mirror can quickly respond to the control signal. Voltage clamp protection and discharge protection switches are also designed to protect the circuit from being influenced by the dv/dt. Only one transistor is used in the gate voltage holding module to achieve voltage clamping. The discharge module gates a plurality of high voltage transistors to discharge, thereby matching the discharge intensity with the slope at the time of startup.

Those of ordinary skill in the art can make various other specific modifications and combinations without departing from the essence of the present invention based on the technical enlightenment disclosed in the present invention, and these modifications and combinations still fall within the protection scope of the present invention.

What is claimed is:

1. A segmented direct gate drive circuit of a depletion mode GaN power device, wherein an output signal of the segmented direct gate drive circuit is used to control charging and discharging of a gate voltage of the depletion mode GaN power device; the depletion mode GaN power device is turned off when a gate voltage is discharged to a negative voltage turn-off level, and turned on when the gate voltage is charged to a zero level;

the segmented direct gate drive circuit comprises a fast charging module, a current mirror charging module, a gate voltage holding module and a discharging module; a fast charging module is used to charge the gate voltage of the GaN power device from the negative voltage turn-off level to a threshold voltage of the GaN power device; the fast charging module comprises a fast charging unit, a threshold setting unit and a one-out-of-two switching unit, the threshold setting unit comprises an adjustable resistor, a first capacitor, a first current mirror unit, a second current mirror unit, a first high voltage PMOS transistor, a second high voltage PMOS transistor, a fifth high voltage PMOS transistor, a sixth high voltage PMOS transistor, a fourth high voltage NMOS transistor and a fifth high voltage NMOS transistor, the first current mirror unit is used to mirror a bias current to obtain a first mirror current and a second mirror current;

the first end of the adjustable resistor is grounded, and the second end of the adjustable resistor is connected to a source of the first high voltage PMOS transistor;

a source of the second high voltage PMOS transistor is connected to a gate and a drain of the first high voltage PMOS transistor, and a gate and a drain of the second high voltage PMOS transistor are interconnected and connected to gates of the fifth high voltage PMOS transistor, the fourth high voltage NMOS transistor and the fifth high voltage NMOS transistor and the first mirror current, and are connected via the first capacitor to a ground voltage of 0V;

the second current mirror unit is used to mirror the second mirror current to obtain a third mirror current;

a gate of the sixth high voltage PMOS transistor is connected to sources of the fifth high voltage PMOS transistor and the fourth high voltage NMOS transistor and the third mirror current, a source of the sixth high voltage PMOS transistor is connected to the source of the fifth high voltage NMOS transistor and is used as an output terminal of the threshold setting unit, and a drain of the sixth high voltage PMOS transistor is connected to a drain of the fifth high voltage PMOS transistor and the negative voltage turn-off level;

wherein drains of the fourth high voltage NMOS transistor and the fifth high voltage NMOS transistor are connected to the ground voltage;

the one-out-of-two switching unit comprises a fourth resistor, a seventh high voltage PMOS transistor, a sixth high voltage NMOS transistor and a seventh high voltage NMOS transistor;

wherein a gate of the seventh high voltage PMOS transistor is connected to a first control signal, a source of the seventh high voltage PMOS transistor is connected via the fourth resistor to the ground voltage, and a drain of the seventh high voltage PMOS transistor is connected to a gate and a drain of the sixth high voltage NMOS transistor, and a gate and a drain of the seventh high voltage NMOS transistor;

the first control signal is a short pulse signal, a rising edge of which is triggered by a rising edge of an input signal of the segmented direct gate drive circuit;

the drain of the sixth high voltage NMOS transistor is used as a first selection terminal of the one-out-of-two switching unit to connect to the output terminal of the threshold setting unit, and the drain of the seventh high voltage NMOS transistor is used as a second selection terminal of the one-out-of-two switching unit;

the fast charging unit comprises a fifth resistor and an eighth high voltage NMOS transistor, a gate of the eighth high voltage NMOS transistor is connected to the second selection terminal of the one-out-of-two switching unit and one end of the fifth resistor, a drain of the eighth high voltage NMOS transistor is connected to the ground voltage, and a source of the eighth high voltage NMOS transistor is connected to the other end of the fifth resistor and is used as an output terminal of the fast charging module to connect to a gate of the depletion mode GaN power device;

the current mirror charging module comprises N charging current mirror modules, where N is a positive integer greater than 1, and the N charging current mirror modules are respectively used to mirror an adjustable current under control of their corresponding gating signals; each of the charging current mirror modules mirror the adjustable current when its corresponding gating signal is valid, otherwise an output current value is zero; the currents mirrored by the N charging current mirror modules are collectively used to charge the gate voltage of the GaN power device; when the fast charging module charges the gate voltage of the GaN power device to the threshold voltage of the GaN power device, less than N of the charging current mirror modules are first turned on to charge the gate voltage of the GaN power device from the threshold voltage of the GaN power device to a Miller platform voltage of the GaN power device, and then the N charging current mirror modules are turned on to charge the gate voltage of the GaN power device from the Miller platform voltage of the GaN power device to the zero level;

the gate voltage holding module is used to clamp the gate voltage of the GaN power device at the zero level from the time when the gate voltage of the GaN power device is charged by the current mirror charging module to the zero level until the gate voltage of the GaN power device starts to discharge;

the discharging module comprises M discharge paths to discharge the gate voltage of the GaN power device, so that the gate voltage of the GaN power device is discharged from the zero level to the negative voltage turn-off level, where M is a positive integer greater than 1; a discharge speed of the gate voltage of the GaN power device is adjusted by controlling the gating of the M discharge paths.

2. The segmented direct gate drive circuit of a depletion mode GaN power device according to claim 1, wherein the adjustable resistor comprises a first PMOS transistor, a second PMOS transistor, a first resistor, a second resistor and a third resistor; a gate of the first PMOS transistor is connected to a first trim control signal, a source of the first PMOS transistor is connected to one end of the first resistor and the ground voltage, and a drain of the first PMOS transistor is connected to the other end of the first resistor;

a gate of the second PMOS transistor is connected to a second trim control signal, a source of the second PMOS transistor is connected to one end of the second resistor and the drain of the first PMOS transistor, and a drain of the second PMOS transistor is connected to the other end of the second resistor and connected via the third resistor to the source of the first high voltage PMOS transistor.

3. The segmented direct gate drive circuit of a depletion mode GaN power device according to claim 2, wherein the gate voltage holding module comprises an eleventh high voltage PMOS transistor and a tenth resistor; a gate of the eleventh high voltage PMOS transistor is connected to a third control signal, a source of the eleventh high voltage PMOS transistor is connected to the ground voltage, and a drain of the eleventh high voltage PMOS transistor is connected via the tenth resistor to the gate of the depletion mode GaN power device; the third control signal is flipped to low when the gate voltage of the GaN power device is charged to the zero level, and is flipped to high when the gate voltage of the GaN power device starts to discharge.

4. The segmented direct gate drive circuit of a depletion mode GaN power device according to claim 1, wherein the gate voltage holding module comprises an eleventh high voltage PMOS transistor and a tenth resistor; a gate of the eleventh high voltage PMOS transistor is connected to a third control signal, a source of the eleventh high voltage PMOS transistor is connected to the ground voltage, and a drain of the eleventh high voltage PMOS transistor is connected via the tenth resistor to the gate of the depletion mode GaN power device; the third control signal is flipped to low when the gate voltage of the GaN power device is charged to the zero level, and is flipped to high when the gate voltage of the GaN power device starts to discharge.

5. The segmented direct gate drive circuit of a depletion mode GaN power device according to claim 4, wherein the charging current mirror module comprises a high bandwidth current mirror unit, a main charging path, a voltage clamp protection unit and a discharge protection switching unit, the high bandwidth current mirror unit comprises a first NAND gate, a first inverter chain, a sixth resistor, a seventh resistor, a ninth resistor, a second capacitor, an eighth high voltage PMOS transistor, a ninth high voltage PMOS transistor, a tenth high voltage PMOS transistor, a ninth high voltage NMOS transistor, a tenth high voltage NMOS transistor, a fifteenth high voltage NMOS transistor, a fourth NMOS transistor and a fifth NMOS transistor; the first inverter chain comprises an odd number of cascaded inverters;

a first input terminal of the first NAND gate is connected to a second control signal, a second input terminal of the first NAND gate is connected to a gating signal corresponding to the charging current mirror module, and an output terminal of the first NAND gate is connected via the first inverter chain to a drain of the ninth high voltage NMOS transistor and a gate of the tenth high voltage NMOS transistor; a rising edge of the second control signal is synchronized with the rising edge of the input signal of the segmented direct gate drive circuit; the second control signal is flipped to low when the gate voltage of the GaN power device is charged to the zero level;

a drain of the eighth high voltage PMOS transistor is connected to a drain of the tenth high voltage NMOS transistor and the gate of the tenth high voltage PMOS transistor, and is connected via the seventh resistor to a power supply voltage, a gate of the eighth high voltage PMOS transistor is connected to a gate of the ninth high voltage PMOS transistor and a source of the tenth high voltage PMOS transistor and is connected via the sixth resistor to the power supply voltage, and a source of the eighth high voltage PMOS transistor is connected to a source of the ninth high voltage PMOS transistor and the power supply voltage;

a drain of the fifth NMOS transistor is connected to the gate and the source of the ninth high voltage NMOS transistor and the source of the tenth high voltage NMOS transistor, a gate of the fifth NMOS transistor is connected to a gate and a drain of the fourth NMOS transistor and the adjustable current and is connected via the second capacitor to the ground level, and a source of the fifth NMOS transistor is connected to a source of the fourth NMOS transistor and the ground level;

the ninth resistor is connected between a drain of the tenth high voltage PMOS transistor and the ground level; a drain of the ninth high voltage PMOS transistor is connected to a gate and a drain of the fifteenth high voltage NMOS transistor;

the main charging path comprises a sixteenth high voltage NMOS transistor; a width-to-length ratio of the sixteenth high voltage NMOS transistor is much larger than that of the fifteenth high voltage NMOS transistor;

a gate of the sixteenth high voltage NMOS transistor is connected to the gate and the drain of the fifteenth high voltage NMOS transistor, a drain of the sixteenth high voltage NMOS transistor is connected to the ground level, and a source of the sixteenth high voltage NMOS transistor is connected to a source of the fifteenth high voltage NMOS transistor and is used as an output terminal of the charging current mirror module to connect to the gate of the depletion mode GaN power device;

the discharge protection switching unit comprises a second inverter chain and a seventeenth high voltage NMOS transistor; the second inverter chain comprises an even number of cascaded inverters; an input terminal of the second inverter chain is connected to a fourth control signal, and an output terminal of the second inverter chain is connected to a gate of the seventeenth high voltage NMOS transistor;

the fourth control signal is flipped to a low level when the gate voltage of the depletion mode GaN power device starts to charge, and the fourth control signal is flipped to a high level when the gate voltage of the depletion mode GaN power device starts to discharge;

a drain of the seventeenth high voltage NMOS transistor is connected to the gate of the sixteenth high voltage NMOS transistor, and a source of the seventeenth high voltage NMOS transistor is connected to the negative voltage turn-off level;

the voltage clamp protection unit comprises an eleventh high voltage NMOS transistor, a twelfth high voltage NMOS transistor, a thirteenth high voltage NMOS transistor, a fourteenth high voltage NMOS transistor and an eighth resistor, a gate and a source of the eleventh high voltage NMOS transistor are connected to one end of the eighth resistor, a source of the fourteenth high voltage NMOS transistor and the output terminal of the charging current mirror module, and a drain of the eleventh high voltage NMOS transistor is connected to a gate and a drain of the twelfth high voltage NMOS transistor, a drain of the fourteenth high voltage NMOS transistor and the gate of the sixteenth high voltage NMOS transistor;

a gate and a drain of the thirteenth high voltage NMOS transistor are connected to a source of the twelfth high voltage NMOS transistor, and a source of the thirteenth high voltage NMOS transistor is connected to a gate of the fourteenth high voltage NMOS transistor and the other end of the eighth resistor.

6. The segmented direct gate drive circuit of a depletion mode GaN power device according to claim 1, wherein the charging current mirror module comprises a high bandwidth current mirror unit, a main charging path, a voltage clamp protection unit and a discharge protection switching unit, the high bandwidth current mirror unit comprises a first NAND gate, a first inverter chain, a sixth resistor, a seventh resistor, a ninth resistor, a second capacitor, an eighth high voltage PMOS transistor, a ninth high voltage PMOS transistor, a tenth high voltage PMOS transistor, a ninth high voltage NMOS transistor, a tenth high voltage NMOS transistor, a fifteenth high voltage NMOS transistor, a fourth NMOS transistor and a fifth NMOS transistor; the first inverter chain comprises an odd number of cascaded inverters;

a first input terminal of the first NAND gate is connected to a second control signal, a second input terminal of the first NAND gate is connected to a gating signal corresponding to the charging current mirror module, and an output terminal of the first NAND gate is connected via the first inverter chain to a drain of the ninth high voltage NMOS transistor and a gate of the tenth high voltage NMOS transistor; a rising edge of the second control signal is synchronized with the rising edge of the input signal of the segmented direct gate drive circuit; the second control signal is flipped to low when the gate voltage of the GaN power device is charged to the zero level;

a drain of the eighth high voltage PMOS transistor is connected to a drain of the tenth high voltage NMOS transistor and the gate of the tenth high voltage PMOS transistor, and is connected via the seventh resistor to a power supply voltage, a gate of the eighth high voltage PMOS transistor is connected to a gate of the ninth high voltage PMOS transistor and a source of the tenth high voltage PMOS transistor and is connected via the sixth resistor to the power supply voltage, and a source of the eighth high voltage PMOS transistor is connected to a source of the ninth high voltage PMOS transistor and the power supply voltage;

a drain of the fifth NMOS transistor is connected to the gate and the source of the ninth high voltage NMOS transistor and the source of the tenth high voltage NMOS transistor, a gate of the fifth NMOS transistor is connected to a gate and a drain of the fourth NMOS transistor and the adjustable current and is connected via the second capacitor to the ground level, and a source of the fifth NMOS transistor is connected to a source of the fourth NMOS transistor and the ground level;

the ninth resistor is connected between a drain of the tenth high voltage PMOS transistor and the ground level; a drain of the ninth high voltage PMOS transistor is connected to a gate and a drain of the fifteenth high voltage NMOS transistor;

the main charging path comprises a sixteenth high voltage NMOS transistor; a width-to-length ratio of the sixteenth high voltage NMOS transistor is much larger than that of the fifteenth high voltage NMOS transistor;

a gate of the sixteenth high voltage NMOS transistor is connected to the gate and the drain of the fifteenth high voltage NMOS transistor, a drain of the sixteenth high voltage NMOS transistor is connected to the ground level, and a source of the sixteenth high voltage NMOS transistor is connected to a source of the fifteenth high voltage NMOS transistor and is used as an output terminal of the charging current mirror module to connect to the gate of the depletion mode GaN power device;

the discharge protection switching unit comprises a second inverter chain and a seventeenth high voltage NMOS transistor; the second inverter chain comprises an even number of cascaded inverters; an input terminal of the second inverter chain is connected to a fourth control signal, and an output terminal of the second inverter chain is connected to a gate of the seventeenth high voltage NMOS transistor;

the fourth control signal is flipped to a low level when the gate voltage of the depletion mode GaN power device starts to charge, and the fourth control signal is flipped to a high level when the gate voltage of the depletion mode GaN power device starts to discharge;

a drain of the seventeenth high voltage NMOS transistor is connected to the gate of the sixteenth high voltage NMOS transistor, and a source of the seventeenth high voltage NMOS transistor is connected to the negative voltage turn-off level;

the voltage clamp protection unit comprises an eleventh high voltage NMOS transistor, a twelfth high voltage NMOS transistor, a thirteenth high voltage NMOS transistor, a fourteenth high voltage NMOS transistor and an eighth resistor, a gate and a source of the eleventh high voltage NMOS transistor are connected to one end of the eighth resistor, a source of the fourteenth high voltage NMOS transistor and the output terminal of the charging current mirror module, and a drain of the eleventh high voltage NMOS transistor is connected to a gate and a drain of the twelfth high voltage NMOS transistor, a drain of the fourteenth high voltage NMOS transistor and the gate of the sixteenth high voltage NMOS transistor;

a gate and a drain of the thirteenth high voltage NMOS transistor are connected to a source of the twelfth high voltage NMOS transistor, and a source of the thirteenth high voltage NMOS transistor is connected to a gate of the fourteenth high voltage NMOS transistor and the other end of the eighth resistor.

7. The segmented direct gate drive circuit of a depletion mode GaN power device according to claim 6, wherein the discharging module comprises a discharge control logic unit and eight discharge paths; the discharge control logic unit is used for generating gating signals corresponding to each of the eight discharge paths under enablement of the fourth control signal;

the discharge path comprises a drive unit and an eighteenth high voltage NMOS transistor; a drain end of the eighteenth high voltage NMOS transistor has a higher voltage resistance capability than that of high voltage switching transistors in the fast charging module, the current mirror charging module and the gate voltage holding module; the drive unit comprises a second NAND gate and a third inverter chain; the third inverter chain comprises an odd number of cascaded inverters; a first input terminal of the second NAND gate is connected to the fourth control signal, a second input terminal of the second NAND gate is connected to a gating signal corresponding to the discharge path, and an output terminal of the second NAND gate is connected via the third inverter chain to a gate of the eighteenth high voltage NMOS transistor; a drain of the eighteenth high voltage NMOS transistor is connected to the gate of the depletion mode GaN power device, and a source of the eighteenth high voltage NMOS transistor is connected to the negative voltage turn-off signal.

8. The segmented direct gate drive circuit of a depletion mode GaN power device according to claim 7, wherein the discharge control logic unit gates the eight discharge paths according to a fourth gating control signal and a fifth gating control signal; when both the fourth gating control signal and the fifth gating control signal are at a low level, one of the eight discharge paths is gated; when the fourth gating control signal is at a high level and the fifth gating control signal is at a low level, two of the eight discharge paths are gated; when the fourth gating control signal is at a low level and the fifth gating control signal is at a high level, four of the eight discharge paths are gated; when both the fourth gating control signal and the fifth gating control signal are at a high level, the eight discharge paths are gated; by controlling gating of the eight discharge paths, a turn-off delay of the GaN power device is matched with a turn-on delay of the GaN power device.

9. The segmented direct gate drive circuit of a depletion mode GaN power device according to claim 8, wherein the first current source comprises a first NMOS transistor, a second NMOS transistor, a third NMOS transistor, a first high voltage NMOS transistor, a second high voltage NMOS transistor and a third high voltage NMOS transistor, a gate and a drain of the first high voltage NMOS transistor is short-circuited and connected to gates of the second high voltage NMOS transistor and the third high voltage NMOS transistor and the bias current, and the source of the first high voltage NMOS transistor is connected to a gate and a drain of the first NMOS transistor and gates of the second NMOS transistor and the third NMOS transistor;

a drain of the second high voltage NMOS transistor outputs the first mirror current, and a source of the second high voltage NMOS transistor is connected to a drain of the second NMOS transistor;

a drain of the third high voltage NMOS transistor outputs the second mirror current, and a source of the third high voltage NMOS transistor is connected to a drain of the third NMOS transistor;

sources of the first NMOS transistor, the second NMOS transistor and the third NMOS transistor are connected to the negative voltage turn-off level;

the second current source comprises a third PMOS transistor, a fourth PMOS transistor, a third high voltage PMOS transistor and a fourth high voltage PMOS transistor; a gate and a drain of the third high voltage PMOS transistor are short-circuited and connected to a gate of the fourth high voltage PMOS transistor and the second mirror current, and a source of the third high voltage PMOS transistor is connected to a gate and a drain of the third PMOS transistor and a gate of the fourth PMOS transistor;

a source of the fourth PMOS transistor is connected to a source of the third PMOS transistor, and a drain of the fourth PMOS transistor is connected to a source of the fourth high voltage PMOS transistor;

a drain of the fourth high voltage PMOS transistor outputs the third mirror current.

10. The segmented direct gate drive circuit of a depletion mode GaN power device according to claim 1, wherein the first current source comprises a first NMOS transistor, a second NMOS transistor, a third NMOS transistor, a first high voltage NMOS transistor, a second high voltage NMOS transistor and a third high voltage NMOS transistor,

- a gate and a drain of the first high voltage NMOS transistor is short-circuited and connected to gates of the second high voltage NMOS transistor and the third high voltage NMOS transistor and the bias current, and the source of the first high voltage NMOS transistor is connected to a gate and a drain of the first NMOS transistor and gates of the second NMOS transistor and the third NMOS transistor;
- a drain of the second high voltage NMOS transistor outputs the first mirror current, and a source of the second high voltage NMOS transistor is connected to a drain of the second NMOS transistor;
- a drain of the third high voltage NMOS transistor outputs the second mirror current, and a source of the third high voltage NMOS transistor is connected to a drain of the third NMOS transistor;

sources of the first NMOS transistor, the second NMOS transistor and the third NMOS transistor are connected to the negative voltage turn-off level;

the second current source comprises a third PMOS transistor, a fourth PMOS transistor, a third high voltage PMOS transistor and a fourth high voltage PMOS transistor; a gate and a drain of the third high voltage PMOS transistor are short-circuited and connected to a gate of the fourth high voltage PMOS transistor and the second mirror current, and a source of the third high voltage PMOS transistor is connected to a gate and a drain of the third PMOS transistor and a gate of the fourth PMOS transistor;

a source of the fourth PMOS transistor is connected to a source of the third PMOS transistor, and a drain of the fourth PMOS transistor is connected to a source of the fourth high voltage PMOS transistor;

a drain of the fourth high voltage PMOS transistor outputs the third mirror current.

* * * * *